United States Patent [19]

Jaffe

[11] Patent Number: 5,031,143

[45] Date of Patent: Jul. 9, 1991

[54] PREAMPLIFIER FOR FERROELECTRIC MEMORY DEVICE SENSE AMPLIFIER

[75] Inventor: James M. Jaffe, Santa Clara, Calif.

[73] Assignee: National Semiconductor Corporation, Santa Clara, Calif.

[21] Appl. No.: 616,676

[22] Filed: Nov. 21, 1990

[51] Int. Cl.$^5$ ............................................. G11C 11/22
[52] U.S. Cl. ..................... 365/145; 365/149; 365/189.08; 307/246; 307/296.1
[58] Field of Search ............... 365/145, 149, 189.08, 365/117; 307/246, 296.1

[56] References Cited

U.S. PATENT DOCUMENTS

| 4,321,661 | 3/1982 | Sano | 307/246 |
|---|---|---|---|
| 4,853,893 | 8/1989 | Eaton et al. | 365/145 |
| 4,910,708 | 3/1990 | Eaton et al. | 365/149 |
| 4,918,654 | 4/1990 | Eaton et al. | 365/145 |

*Primary Examiner*—Joseph E. Clawson, Jr.
*Attorney, Agent, or Firm*—Flehr, Hohbach, Test, Albritton & Herbert

[57] ABSTRACT

A ferroelectric memory device includes a preamplifier that couples a bit line to a sense amplifier. The preamplifier both provides additional bit line capacitance needed to enable full switching of the ferroelectric capacitor in a selected memory cell, and data signal amplification needed to obtain a reliable data signals from the memory cells after the memory device has aged and the ferroelectric capacitors in the memory cells are generating relatively small voltage signals. More specifically, the preamplifier of the present invention is a set of capacitors which can be switched between two configurations. In the first configuration, used while strobing a selected memory cell, the capacitors are all connected in parallel to the bit line, thereby providing the bit line capacitance needed to enable full switching of the ferroelectric capacitor in the selected memory cell. In the second configuration, used after the memory cell has been strobed, the capacitors in the preamplifier are disconnected from the bit line, and connected in series so as to multiply the voltage developed on the capacitors while the memory cell was strobed. The resulting multiplied or amplified voltage signal is then processed by a sense amplifier.

8 Claims, 3 Drawing Sheets

PREAMPLIFIER FOR FERROELECTRIC MEMORY DEVICE SENSE AMPLIFIER

The present invention relates generally to semiconductor ferroelectric memory devices, and particularly to sense amplifiers used to read data stored in arrays of ferroelectric memory cells.

BACKGROUND OF THE INVENTION

Referring to FIG. 1, in virtually any configuration of ferroelectric memory cells, the ferroelectric capacitor 100 in a selected memory cell with form a capacitive divider with the capacitance of the bit line that is coupled to that memory cell. In FIG. 1 capacitor CB 102 represents a bit line coupled to a ferroelectric capacitor 100 in a selected memory cell by a word line access control transistor 104. The cell is read by strobing the cell with a read pulse 106.

FIG. 2 shows the hysteresis curve (showing the relationship between polarization and electric field) associated with a typical ferroelectric capacitor. For illustrative purposes we shall define that when the cell is in the "0" state, the polarization state of the ferroelectric capacitor is located at point 140 and when it is in the "1" state its polarization state is located at point 142 in FIG. 2. Thus, when a read pulse is asserted on the cell's drive line, if the cell is in the "1" state, the polarization state of the ferroelectric capacitor will move counterclockwise up the right side of the hysteresis curve to point 144 while the pulse is at its peak, and then when the pulse ends, the polarization state of the ferroelectric capacitor will move to point 140. If the cell is in the "0" state when the read pulse is asserted, the polarization or charge across the ferroelectric capacitor will move back up toward the peak 144 and then back to point 140 after the pulse ends.

Referring again to FIG. 1, the polarization change in the cell, caused by the read pulse 106 generates an electrical charge that is divided across the two capacitors 100 and 102 to produce an output voltage Vout equal to $$Vout = \frac{K \times \Delta P}{CB + CF}$$

where K is a conversion constant that converts $\Delta P$ into units of electrical charge, CB is the capacitance of the bit line and CF is the capacitance of the ferroelectric capacitor.

Ferroelectric capacitors have a very high dielectric constant. As a result, the bit line capacitance will typically be less than or equal to the capacitance of even a very small ferroelectric capacitor. However, to enable proper switching of the ferroelectric capacitor, the bit line capacitance should be equal to or, better yet, greater than the capacitance of the ferroelectric capacitor in the memory cell.

On the other hand, making the bit line capacitance larger makes the voltage signal on the bit line 212 smaller. For instance, if the full voltage swing of the drive line is one volt and the bit line capacitance is increased to be equal to twice the capacitance of the ferroelectric capacitor, then the voltage signal output by the ferroelectric capacitor on the bit line will be about 330 millivolts. As the ferroelectric capacitor ages, it will generate smaller switching voltages, and the resulting bit line signal may become less than 100 millivolts, which can be difficult to accurately detect with a sense amplifier.

SUMMARY OF THE INVENTION

The present invention overcomes the problems associated bit line capacitance and signal strength in ferroelectric memory devices by providing a preamplifier that couples a bit line to a sense amplifier. The preamplifier both provides the additional bit line capacitance needed to enable full switching of the ferroelectric capacitor in a selected memory cell, and data signal amplification needed to obtain reliable data signals from the memory cells after the memory device has aged and the ferroelectric capacitors in the memory cells are generating relatively small voltage signals.

More specifically, the preamplifier of the present invention is a set of capacitors which can be switched between two configurations. In the first configuration, used while strobing a selected memory cell, the preamplifier's capacitors are all connected in parallel to the bit line, thereby providing the bit line capacitance needed to enable full switching of the ferroelectric capacitor in the selected memory cell. In the second configuration, used after the memory cell has been strobed, the preamplifier's capacitors are disconnected from the bit line, and connected in series so as to multiply the voltage developed on the capacitors while the memory cell was strobed. The resulting multiplied or amplified voltage signal is then processed by a sense amplifier.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
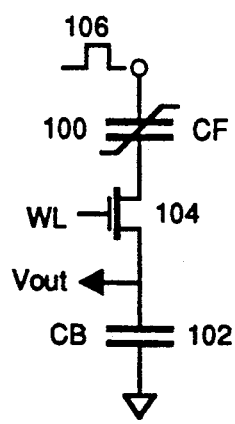
FIG. 1 schematically depicts a single ferroelectric memory cell coupled to a bit line.
Figure 2:
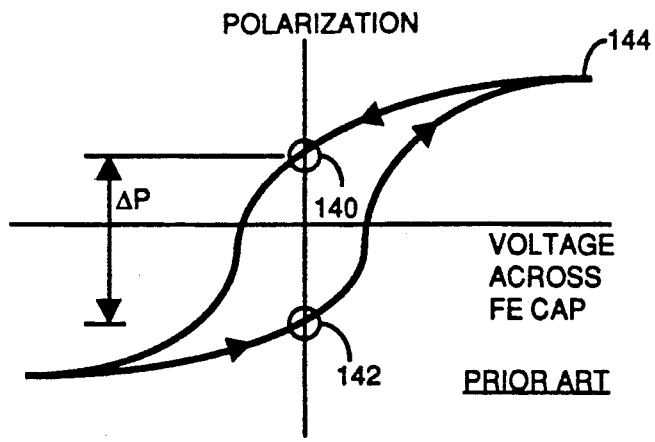
FIG. 2 depicts a hysteresis loop for a ferroelectric memory cell.
Figure 3:
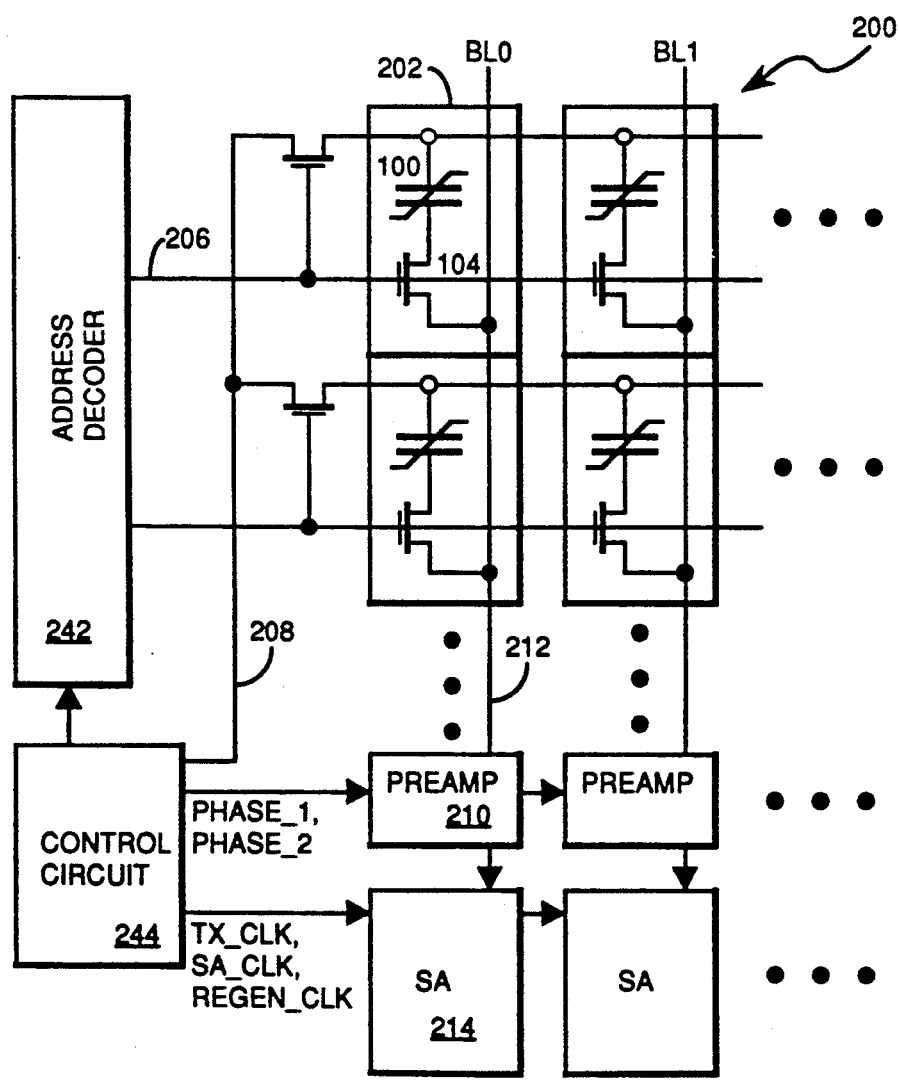
FIG. 3 is a block diagram of an array of ferroelectric memory cells with preamplifiers and sense amplifiers in accordance with the present invention.

Referring to FIG. 3, there is shown a ferroelectric memory device in accordance with the present invention. The memory device contains an array 200 of ferroelectric memory cells 202, each of which contains a ferroelectric capacitor 100 and an access control transistor 104 which is gated by a word line 206. Using the memory array 200 of the present invention, only one cell is required to store a bit of data. A memory cell 202 is selected for access by enabling word line 206 and is then read by sending a pulse or strobe signal on drive line 208.

At the end of each bit line 212 there is a preamplifier circuit 210 followed by a sense amplifier 214. The amplified bit line signal which is generated by the preamplifier 210 is transmitted to a sense amplifier 214.

Figure 5:
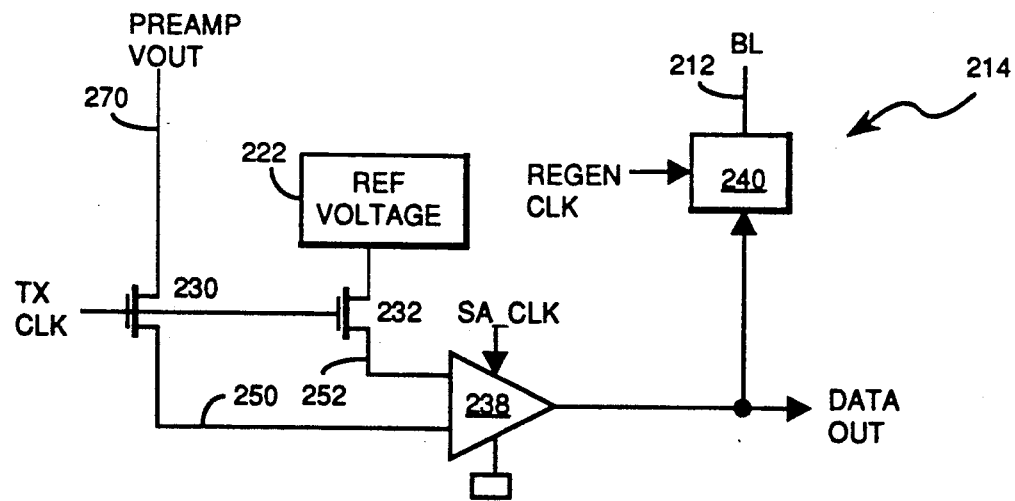
FIG. 5 is a block diagram of a sense amplifier.
Figure 6:
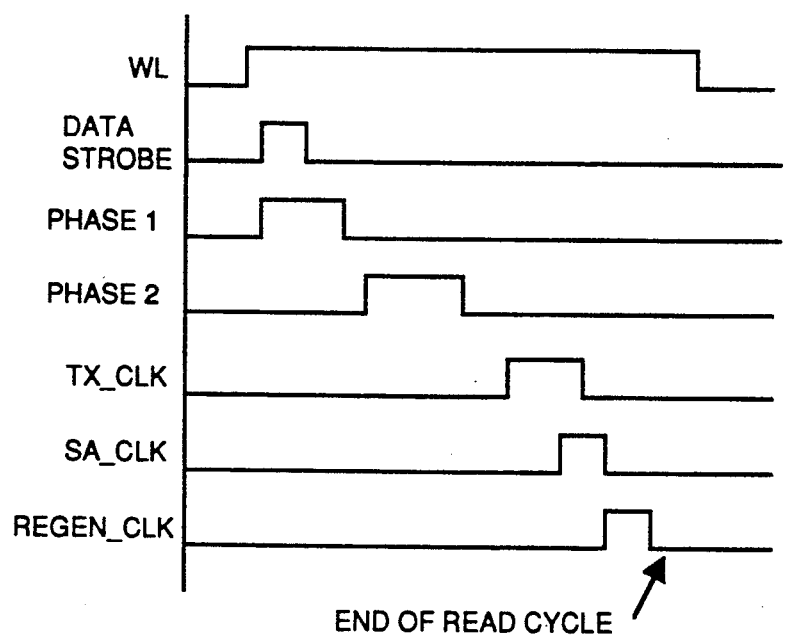
FIG. 6 is a timing diagram related to use of the preamplifier circuit shown in FIG. 4.

As shown in FIG. 5, the sense amplifier 214 contains gating transistors 230 and 232. Gating transistor 230 transmits the output voltage from the preamplifier circuit 210 to one input port of a cross-coupled differential amplifier 238, which generates a data out signal. The other input port of the differential amplifier 238 is coupled by gate 232 to a reference voltage 222. A data regeneration circuit 240 is used to rewrite data back into the cell 202 after the data from the cell has been read and thereby destroyed. In addition, as shown in FIG. 3, the memory array 200 has a word line address decoder 242 which decodes a portion of the incoming address signals into word line selection signals, and there is also a control circuit 244 which generates a sequence of timing signals, herein called DATA STROBE, TX—CLK, SA—CLK, REGEN—CLK, PHASE 1 and PHASE 2, required for operating the memory array 200, the preamplifier circuit 210 and the sense amplifier 214 of the preferred embodiment.

Another embodiment of a sense amplifier which can be used with the preamplifier of the present invention is described in patent application Ser. No. 616,605, filed on the same date as the instant application, entitled SENSE AMPLIFIER AND METHOD FOR FERROELECTRIC MEMORY, in the name of James M. Jaffe and Norman E. Abt, hereby incorporated by reference.

Figure 4:
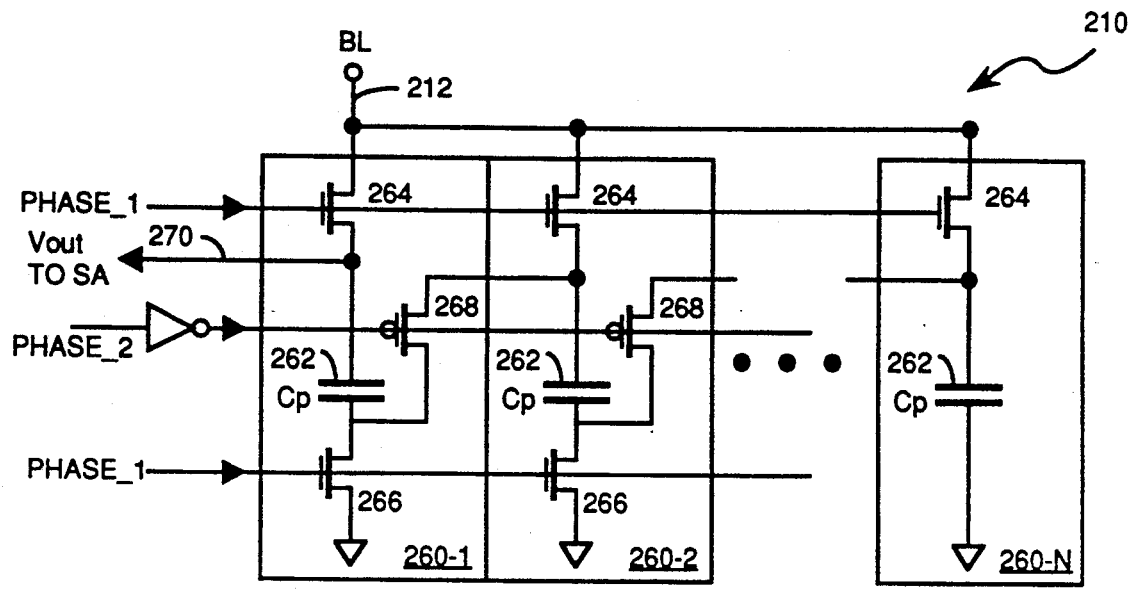
FIG. 4 is a circuit schematic for a preferred embodiment of the preamplifier circuit of the present invention.

Referring to FIG. 4, the preamplifier circuit consists of a sequence of N capacitor "stages" 260-1, 260-2, through 260-N, where N is the number of stages.

Each capacitor stage 260 contains a silicon dioxide capacitor 262. Each stage, except for the last stage 260-N, also contains two sets of transistors. The first set of transistors 264 and 266, when enabled by the PHASE—1 clock signal, connect all the capacitors in the preamplifier circuit in parallel to the bit line 212. When the PHASE—1 clock is disabled, these same transistors disconnect all the capacitors 262 in the preamplifier circuit from the bit line 212, and also disconnect all the capacitors, except for the one in the last stage 260-N, from the common ground node. The second set of transistors 268, when enabled by the PHASE—2 clock signal, connect all the capacitors in series. By switching off PHASE—1 and switching on PHASE—2 (not that the PHASE—2 clock signal is enabled only when the PHASE—1 clock signals is disabled), the preamplifier stages become a charge pump, boosting the voltage on the preamplifier's output node Vout 270.

When the memory cell is first strobed, the capacitors in the preamplifier circuit are held in the parallel configuration by enabling the PHASE—1 clock signal. As a result, the bit line's capacitance is CB+NCp, where CB is the capacitance of the bit line 212 without the preamplifier 210, N is the number of stages 260 in the preamplifier 210, and Cp is the capacitance of the capacitor 262 in each preamplifier stage. The voltage on the bit line 212 after memory cell is pulsed will be $$V_{BL} = \frac{K \times \Delta P}{CF + CB + NCp}$$

where $V_{BL}$ is the voltage on the bit line 212, $\Delta P$ is the polarization change in the cell caused by the read pulse 106, and K is a conversion constant that converts $\Delta P$ into units of electrical charge. Next, PHASE—1 is disabled and PHASE—2 is enabled, so that the capacitors 262 in the preamplifier are now connected in series. The resulting voltage on node 270 of the preamplifier 210 will be $$V_{out} = \frac{N \times K \times \Delta P}{CF + CB + NCp}$$

where Vout is the voltage on node 270 of the preamplifier 210. In any case, the preamplifier amplifies the original bit line signal by a factor of N, where N is the number of stages in the preamplifier 210.

SELECTING NUMBER OF PREAMPLIFIER STAGES AND CAPACITOR SIZES

The number of stages in the preamplifier, and the sizes of the capacitors in those stages, is selected using the following analysis. First one determines the ratio of (A) the ideal amplitude of the data signal obtained from the bit line (e.g., 2.5 volts) to (B) the maximum amplitude of the data signal actually asserted on the bit line by an actual ferroelectric memory cell. Note that the amplitude of the data signal on the bit line will be a function of the total bit line capacitance (e.g., twice the capacitance of the memory cell). The number of stages in the preamplifier should be approximately equal to the ratio just described above. Typically, the number of stages will be between three and eight. Once, the number of stages N has been selected, the capacitors in each stage will be sized so that the total bit line capacitance (i.e., CB+NCp) is equal to a preselected value, such as twice the capacitance of the memory cell (2×CF).

An example of the above described process for designing an preamplifier circuit in accordance with the present invention is as follows. Assume that the memory cell has a capacitance of 1 pF (one picofarad), that the bit line 212 by itself has a parasitic capacitance of 0.5 pF, that the ideal bit line should have a capacitance of 2 pf, and that the maximum amplitude of a data signal generated by the memory cell with a 2 pf bit line is 0.4 volts. If the maximum desired voltage swing is 2.5 volts, the ratio of the maximum desired voltage swing to actual voltage swing on the bit line is 1:6.25. Therefore the amplifier should have six stages, and each capacitor 262 in the preamplifier should have a capacitance CP which is equal to 0.25 pF. In other words, the additional capacitance needed on the bit line, 1.5 pF, is divided by the number of stages in the preamplifier, 6, which comes to a value of 0.25 pF for each capacitor 262.

METHOD OF OPERATION

Referring to FIGS. 3, 4, 5 and 6, the sequence of events for reading data stored in a selected memory cell 202 is as follows. First, the address decoder 242 generates a word line signal on one of the word lines 206, thereby selecting one memory cell on each bit line 212. Then a DATA STROBE, which is a positive going pulse, is asserted on the driver line 208 while the PHASE—1 signal is enabled. This puts a voltage signal on the bit line 212 that is indicative of the data stored in the selected memory cell 202. The data voltage signal is also stored on the capacitors 262 in the preamplifier 210. Then PHASE—1 is disabled and PHASE—2 is enabled so as to preamplify the data voltage signal.

It should be noted that after this read operation, the data in the selected memory cell has been destroyed, and the cell is in the "0" state, regardless of what data was previously stored in the cell.

Next, the TX—CLK is enabled to as to pass the preamplified bit line voltage to one input port of the differential amplifier 238 and to pass a reference voltage to the other input port of the differential amplifier 238.

Shortly after TX_CLK is enabled, the sense amplifier clock SA_CLK is enabled, which causes the amplifier to amplify the voltage differential on lines 250 and 252 and to generate an output signal indicative of the data stored in the selected cell. Finally, the REGEN_CLK is enabled after the amplifier 239 has done its work, enabling the data regeneration circuit 240 to rewrite the read data value back into the selected memory cell.

It may be noted that, in the preferred embodiment, the amplifier 238 functions as a comparator which generates a high voltage if the voltage on line 250 (i.e., the voltage generated by the first strobing of the selected memory cell) exceeds the voltage on line 252 (i.e., the reference voltage) by at least a threshold value. See patent application Ser. No. 616,605, already incorporated by reference above.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A semiconductor memory device, comprising:
   at least one column of memory cells, each column of memory cells coupled to a corresponding bit line, each memory cell being selectively coupled to said corresponding bit line by an access control transistor so that only one memory cell in said column is coupled to said bit line at a time; and
   an amplifier coupled to one of said bit lines, said amplifier having an output node, a plurality of capacitors, a first one of said capacitors being coupled to said output node, and a set of switches which, in one state, connect said capacitors in parallel to said bit line, and which, in a second state, disconnect said capacitors from said bit line and couple said capacitors in series; wherein a voltage signal stored on said capacitors while said set of switches connect said capacitors in parallel is amplified on said output node when said set of switches connect said capacitors in series.

2. The semiconductor memory device of claim 1, further including a sense amplifier coupled to said amplifier, said sense amplifier including a comparator which compares said amplified voltage signal generated by said preamplifier with a reference voltage level and generates an output bit value based on said comparison.

3. The semiconductor memory device of claim 2, further including control means, coupled to said array of memory cells, said amplifier and said sense amplifier; said control means including means for strobing a selected memory cell in said at least one column of memory cells while setting said set of switches in said amplifier to said first stage so as to generate a voltage signal on said bit line; for then setting said set of switches in said amplifier to said second state so as to generate an amplified voltage signal on said output node of said amplifier; and for subsequently enabling said sense amplifier to compare said amplified voltage signal on said output node of said amplifier with a reference voltage and to generate an output bit value based on said comparison.

4. A ferroelectric memory device, comprising:
   at least one column of ferroelectric memory cells, each column of memory cells coupled to a corresponding bit line, each memory cell being selectively coupled to said corresponding bit line by an access control transistor so that only one memory cell in said column is coupled to said bit line at a time; and
   an amplifier coupled to one of said bit lines, said amplifier having an output node, a plurality of capacitors, a first one of said capacitors being coupled to said output node, and a set of switches which, in one state, connect said capacitors in parallel to said bit line, and which, in second state, disconnect said capacitors from said bit line and couple said capacitors in series; wherein a voltage signal stored on said capacitors while said set of switches connect said capacitors in parallel is amplified on said output node when said set of switches connect said capacitors in series.

5. The ferroelectric memory device of claim 4, further including a sense amplifier coupled to said amplifier, said sense amplifier including a comparator which compares said amplified voltage signal generated by said preamplifier with a reference voltage level and generates an output bit value based on said comparison.

6. The ferroelectric memory device of claim 5, further including control means, coupled to said array of memory cells, said amplifier and said sense amplifier; said control means including means for strobing a selected memory cell in said at least one column of memory cells while setting said set of switches in said amplifier to said first state so as to generate a voltage signal on said bit line; for then setting said set of switches in said amplifier to said second state so as to generate an amplified voltage signal on said output node of said amplifier; and for subsequently enabling said sense amplifier to compare said amplified voltage signal on said output node of said amplifier with a reference voltage and to generate an output bit value based on said comparison.

7. A ferroelectric memory device, comprising:
   at least one column of ferroelectric memory cells, each column of memory cells coupled to a corresponding bit line, each memory cell being selectively coupled to said corresponding bit line by an access control transistor so that only one memory cell in said column is coupled to said bit line at a time;
   a preamplifier coupled to one of said bit lines, said preamplifier having an output node and including
   a plurality of capacitors, a first one of said capacitors being coupled to said output node;
   a first set of switching elements which couple said capacitors to said bit line in parallel when said first set of switching elements are enabled and which disconnect said capacitors from said bit line when said first set of switching elements are disabled, and
   a second set of switching elements which connect said capacitors in series when said second set of switching elements are enabled, thereby producing an amplified voltage signal on said output node; and
   control means, coupled to said array of memory cells and said preamplifier, for strobing a selected memory cell in said at least one column of memory cells while enabling said first set of switching elements in said preamplifier, and for then disabling said first set of switching elements in said preamplifier and enabling said second set of switching elements in said preamplifier;

wherein said strobing of said selected memory cell produces a resulting voltage signal on said bit line coupled to said selected memory cell and on said capacitors in said preamplifier, and wherein enabling said second set of switching elements so as to connect said capacitors in said preamplifier in series amplifies said resulting voltage signal on said output node.

8. The ferroelectric random access memory of claim 7, further including a sense amplifier coupled to said preamplifier and said control means, said sense amplifier including a comparator which compares said amplified voltage signal generated by said preamplifier with a reference voltage level and generates an output bit value based on said comparison.

* * * * *